(12) United States Patent
Yamashita (10) Patent No.: US 8,901,990 B2
(45) Date of Patent: Dec. 2, 2014

(54) SEMICONDUCTOR INTEGRATED CIRCUIT DEVICE HAVING POWER ENABLE LINES TRANSFERRING CONTROL SIGNALS

(75) Inventor: Takahiro Yamashita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 13/598,774

(22) Filed: Aug. 30, 2012

(65) Prior Publication Data

US 2013/0222043 A1    Aug. 29, 2013

(30) Foreign Application Priority Data

Dec. 13, 2011   (JP) ................. 2011-272266

(51) Int. Cl.
*H03K 17/16*  (2006.01)

(52) U.S. Cl.
CPC ................ *H03K 17/164* (2013.01)
USPC .......................... 327/384; 327/379

(58) Field of Classification Search
USPC ................. 327/379, 380, 384
See application file for complete search history.

(56) References Cited

U.S. PATENT DOCUMENTS

| | | | |
|---|---|---|---|
| 7,791,369 B2 | 9/2010 | Kamo et al. | |
| 7,924,084 B2 * | 4/2011 | Kojima ................ | 327/427 |
| 7,969,237 B2 | 6/2011 | Fujita et al. | |
| 2008/0278194 A1 | 11/2008 | Kamo et al. | |
| 2010/0259316 A1 | 10/2010 | Fujita et al. | |

FOREIGN PATENT DOCUMENTS

| | | |
|---|---|---|
| JP | 2008-34667 | 2/2008 |
| JP | 2008-283047 | 11/2008 |
| JP | 2010-245403 | 10/2010 |

OTHER PUBLICATIONS

Kazuki Fukuoka, et al., "A 1.92 μs-wake-up time thick-gate-oxide power switch technique for ultra low-power single-chip mobile processors", VLSI2007 (12-4), Symposium on VLSI Circuits Digest of Technical Papers, 2007, pp. 128 and 129.

* cited by examiner

*Primary Examiner* — Hai L Nguyen
(74) *Attorney, Agent, or Firm* — Oblon, Spivak, McClelland, Maier & Neustadt, L.L.P.

(57) ABSTRACT

In the device, a pair of transistors includes first and second transistors connected in parallel between a power-supply-line and a power-supply or between a ground-line and a ground-potential. A third transistor is connected between the power-supply-line and the power-supply or between the ground-line and the ground-potential. First to third nodes are gate nodes of the first to third transistors. A first buffer outputs a first control-signal for controlling the first transistor. A second buffer is connected between the first node and the second and third nodes to receive the first control-signal and transmit a second control-signal for controlling the second and third transistors to the second and third nodes in parallel. When power-supplying starts, the second control signal drives the second and third transistors to the conductive-state after the first control-signal controls the first transistor to be driven in an intermediate-state between the conductive-state and a shutoff-state.

15 Claims, 9 Drawing Sheets

SEMICONDUCTOR INTEGRATED CIRCUIT DEVICE HAVING POWER ENABLE LINES TRANSFERRING CONTROL SIGNALS

CROSS REFERENCE TO RELATED APPLICATIONS

This application is based upon and claims the benefit of priority from the prior Japanese Patent Application No. 2011-272266, filed on Dec. 13, 2011, the entire contents of which are incorporated herein by reference.

FIELD

The embodiments of the present invention relate to a semiconductor integrated circuit device.

BACKGROUND

In a semiconductor integrated circuit device, a power switch is often inserted into a power supply line or a ground line to partially shut off the power. In such a device, a high inrush current sometimes flows to the power supply line to charge the power supply line when the power switch is turned on after turning off to shut off the supply of power. The inrush current possibly generates power-supply noise and adversely affects other active circuit blocks.

DETAILED DESCRIPTION

A semiconductor integrated circuit device according to the present embodiment includes a circuit block, and a power supply line or a ground line supplying power to the circuit block. At least one pair of transistors includes first and second transistors connected in parallel between the power supply line and a power supply or between the ground line and a ground potential. At least one third transistor is connected between the power supply line and the power supply or between the ground line and the ground potential. First to third nodes are connected to gates of the first to third transistors, respectively. A first buffer outputs a first control signal for controlling a conductive state of the first transistor to the first node. A second buffer is connected between the first node and the second and third nodes to receive the first control signal and transmit a second control signal for controlling a conductive state of the second and third transistors to the second and third nodes in parallel. When supply of the power to the circuit block starts, the second control signal drives the second and third transistors to the conductive state after the first control signal controls the first transistor to be driven in an intermediate state between the conductive state and a shut-off state.

Embodiments will now be explained below with reference to the accompanying drawings. The present invention is not limited to the embodiments. Semiconductor integrated circuits according to the embodiments are applicable not only to a semiconductor memory but also to any other integrated circuits.

(First Embodiment)

Figure 1:
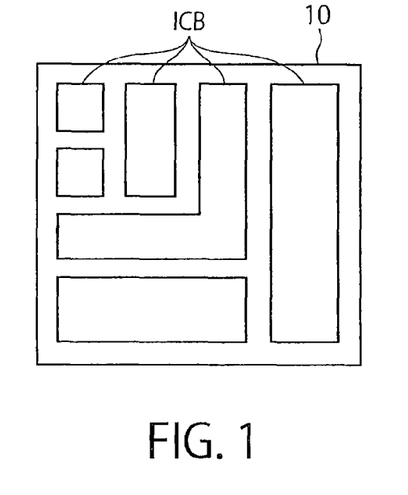
FIG. 1 is a plan view showing a chip of a semiconductor integrated circuit device.

FIG. 1 is a plan view showing a chip of a semiconductor integrated circuit device (hereinafter, also simply "integrated circuit") according to a first embodiment. An integrated circuit 10 includes a plurality of circuit blocks ICB. The integrated circuit 10 also includes switch circuits SWC (see FIG. 2) each of which can supply or shut off power to one of the circuit blocks ICB. The switch circuits SWC are provided to correspond to the circuit blocks ICB, respectively, and can selectively set the corresponding circuit blocks ICB into an inactive state or an active state.

Figure 2:
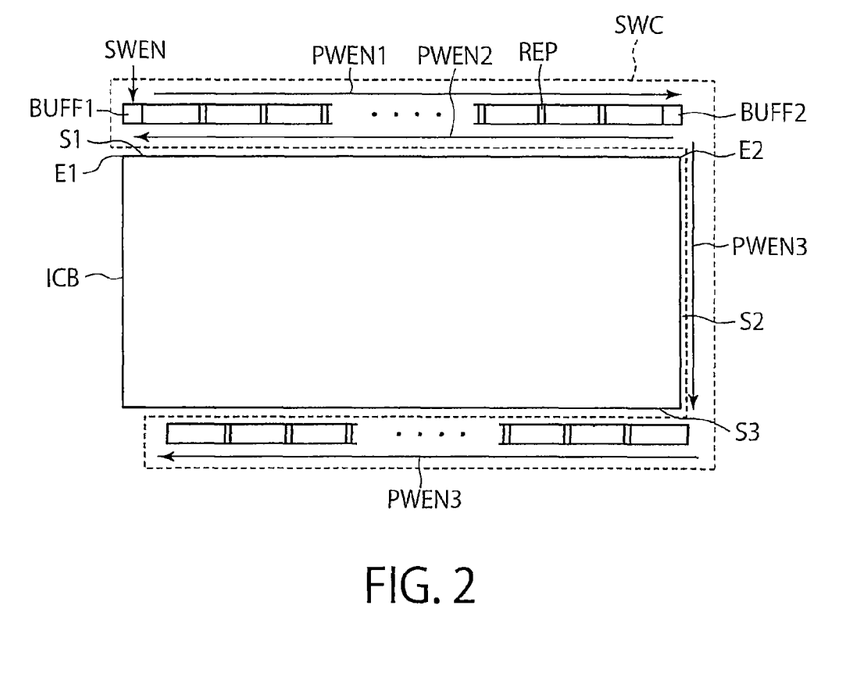
FIG. 2 is a schematic layout diagram showing an arrangement of a certain circuit block ICB and the switch circuit SWC corresponding to the circuit block ICB.

FIG. 2 is a schematic layout diagram showing an arrangement of a certain circuit block ICB and the switch circuit SWC corresponding to the circuit block ICB. The switch circuit SWC is provided around the circuit block ICB, and performs switching of a power supply to the circuit block ICB in response to a switch enable signal SWEN.

The switch circuit SWC includes a first buffer BUFF1, a second buffer BUFF2, a power enable line PWEN1 serving as a first node, a power enable line PWEN2 serving as a second node, and a power enable line PWEN3 serving as a third node.

The first and second buffers BUFF1 and BUFF2 are arranged on both ends E1 and E2 of a first side S1 of the circuit block ICB, respectively. The power enable lines PWEN1 and PWEN2 are wires provided between the first and second buffers BUFF1 and BUFF2 along the first side S1 of the circuit block ICB. The power enable line PWEN3 is a wire provided along a second side S2 of the circuit block ICB adjacent to the first side S1 at the end E2 near the second buffer BUFF2 and along a side S3 thereof opposite to the first side S1.

The power enable lines PWEN2 and PWEN3 branch out from the second buffer BUFF2 and extend in directions along the first side S1 and along the second side S2, respectively.

Figure 3:
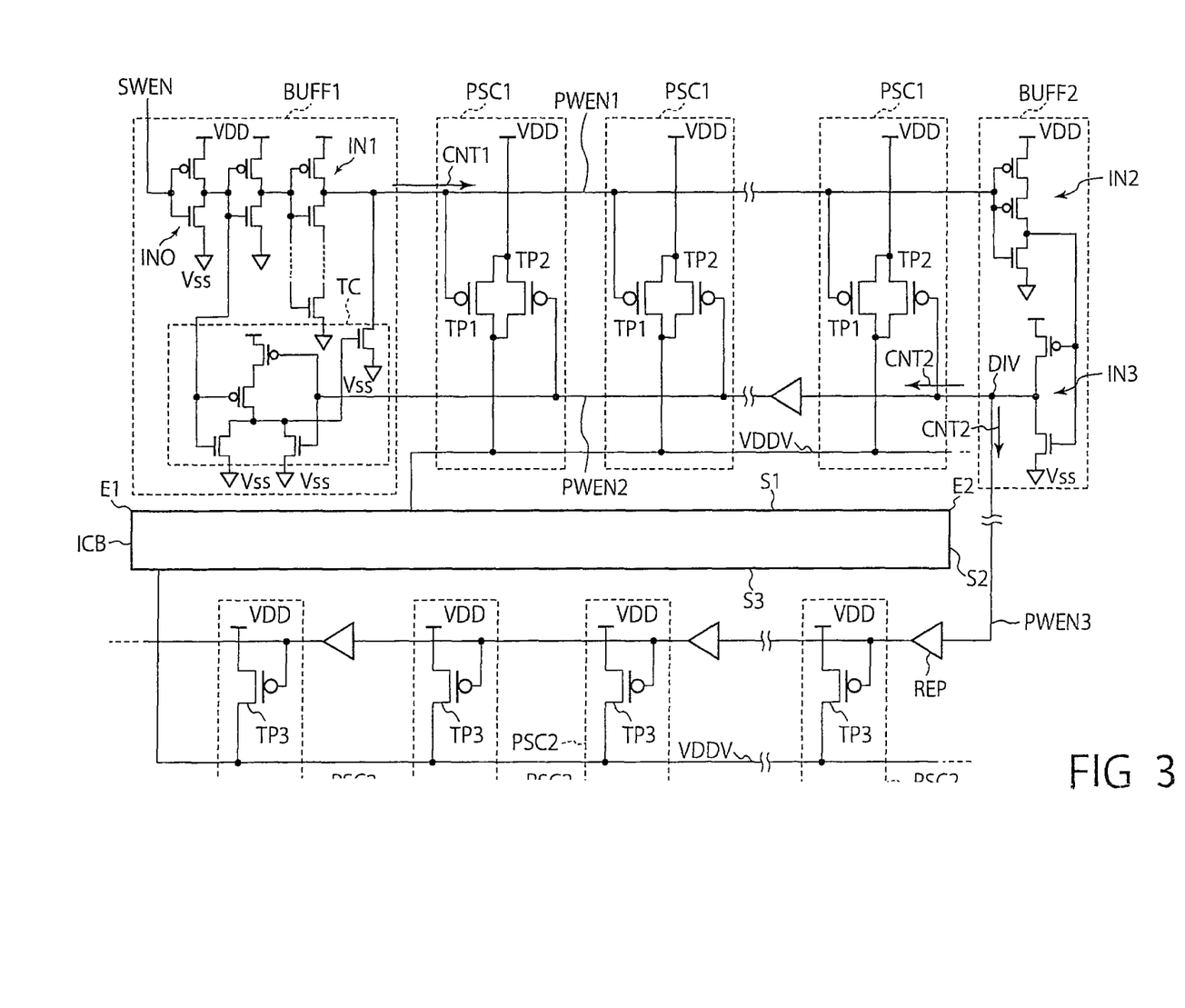
FIG. 3 is a circuit diagram showing a configuration of the switch circuit SWC.

A more specific configuration of the switch circuit SWC is shown in FIG. 3.

FIG. 3 is a circuit diagram showing a configuration of the switch circuit SWC. The switch circuit SWC is connected between a power supply line VDDV supplying power to the circuit block ICB and a power supply VDD. The switch circuit SWC includes a plurality of first power switch cells PSC1 and a plurality of second power switch cells PSC2 connected in parallel between the power supply line VDDV and the power supply VDD, in addition to the first and second buffers BUFF1 and BUFF2.

Each of the first power switch cells PSC1 includes a pair of first and second transistors TP1 and TP2 connected in parallel between the power supply line VDDV and the power supply VDD. Both the first and second transistors TP1 and TP2 are formed using P-FETs (Field Effect Transistors).

A gate of the first transistor TP1 is connected to the power enable line PWEN1 serving as the first node, and a gate of the second transistor TP2 is connected to the power enable line PWEN2 serving as the second node. Accordingly, the first transistor TP1 receives a first control signal CNT1 from the first buffer BUFF1 via the power enable line PWEN1 and is controlled based on the first control signal CNT1. The second transistor TP2 receives a second control signal CNT2 from the second buffer BUFF2 via the power enable line PWEN2 and is controlled based on the second control signal CNT2.

Each of the second power switch cells PSC2 includes a third transistor TP3 connected between the power supply line VDDV and the power supply VDD. The third transistor TP3 is formed using a P-FET. A gate of the third transistor TP3 is connected to the power enable line PWEN3 serving as the third node. Accordingly, the third transistor TP3 receives the second control signal CNT2 from the second buffer BUFF2 via the power enable line PWEN3 and is controlled based on the second control signal CNT2.

Figure 10:
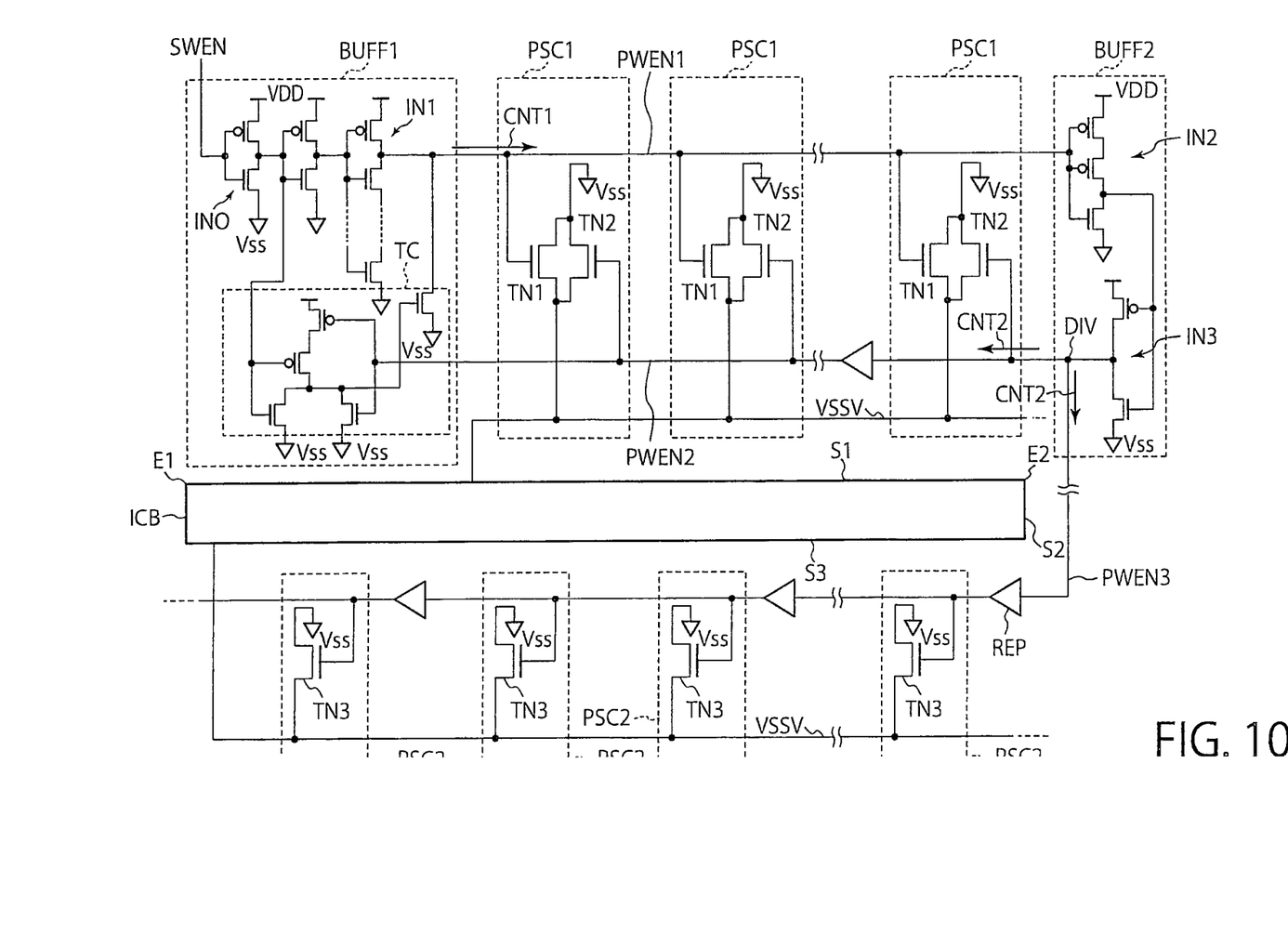
FIG. 10 is a circuit diagram showing a configuration of a switch circuit SWC using the N-FETs in the power cell switches PSC1 and PSC2.

Alternatively, N-FETs can be used for the first to third transistors. In this case, as shown in FIG. 10, first to third transistors TN1 to TN3 are connected between a ground potential VSS and a ground line VSSV. While the switch circuit SWC using the N-FETs as the first to third transistors can be readily inferred from the descriptions of the switch circuit SWC using the P-FET as the first to third transistors, such a switch circuit SWC is described later. The description is continued hereinafter while assuming that the first to third transistors TP1 to TP3 are connected between the power supply line VDDV and the power supply VDD.

The power enable line PWEN3 is branched off from the power enable line PWEN2 at a branch point DIV in the second buffer BUFF2. Therefore, the power enable line PWEN3 transmits the second control signal CNT2 in parallel to the power enable line PWEN2 and controls the third transistor TP3 within each of the second power switch cells PSC2.

Preferably, the size (channel width/channel length) of the first transistor TP1 is sufficiently smaller than a sum of the size (channel width/channel length) of the second transistor TP2 and that of the third transistor TP3. With this setting, it is possible to raise a power supply voltage with hardly generating power-supply noise soon after power return.

The power enable lines PWEN1 to PWEN3 are provided around the circuit block ICB as the wires and are made using a conductive material such as metal or doped polysilicon.

The first buffer BUFF1 is connected between a signal line of the switch enable signal SWEN and the power enable line PWEN1. The first buffer BUFF1 includes inverter circuits IN0 and IN1 connected between the power supply VDD and a reference potential (ground potential, for example) VSS. The inverter circuits IN0 and IN1 act to transmit the switch enable signal SWEN as the first control signal CNT1 to the power enable line PWEN1. The inverter circuits IN0 and IN1 set the first control signal CNT1 at an analog intermediate potential. For example, the first control signal CNT1 is set to have an intermediate potential between a high level voltage and a low level voltage, thereby controlling the first transistor TP1 into a slightly conductive state, which is an intermediate state between a conductive state (ON) and a shutoff state (OFF). A delay time which is caused by the first transistors TP1 and for which the control signal CNT is transmitted to the second buffer BUFF2 can be set by changing the number of N-FETs included in the last inverter circuit IN1.

The first buffer BUFF1 also includes a termination circuit TC connected to the power enable line PWEN2. The termination circuit TC sets the first transistors TP1 into a conductive state by setting the power enable line PWEN1 at a low level voltage VSS when receiving the second control signal CNT2 from the second buffer BUFF2 after the switch enable signal SWEN is activated to have a high level voltage. That is, the first buffer BUFF1 controls the first transistors TP1 into a slightly conductive state by transmitting the first control signal CNT1 to the power enable line PWEN1 and then controls the first transistors TP1 into a normal conductive state when receiving the second control signal CNT2.

The second buffer BUFF2 includes two inverter circuits IN2 and IN3, for example. The second buffer BUFF2 outputs the second control signal CNT2 in response to the first control signal CNT1. At this time, the front inverter circuit IN2 that receives the first control signal CNT1 transmits a sufficiently high level voltage to the rear inverter circuit IN3 under the control of the first control signal CNT1. The second buffer BUFF2 can thereby output the second control signal CNT2 controlling the transistors TP2 and TP3 into a sufficiently conductive state to the power enable lines PWEN2 and PWEN3. That is, the second buffer BUFF2 can transmit the second control signal CNT2 controlling the conductive state of the second and third transistors TP2 and TP3 in parallel to the power enable lines PWEN2 and PWEN3 in response to the first control signal CNT1.

Repeaters REP serving as buffers can be provided at arbitrary positions, respectively, at some point along the power enable lines PWEN1 to PWEN3.

An operation performed by the switch circuit SWC according to the first embodiment is explained next.

When the supply of power to the circuit block ICB starts, the switch enable signal SWEN is activated to have a high level voltage. In response to the activation of the switch enable signal SWEN, the first buffer BUFF1 outputs the first control signal CNT1 to the power enable line PWEN1.

The first control signal CNT1 controls the first transistor TP1 within each of the first power switch cells PSC1 into an intermediate state (a slightly conductive state). A current from the power supply VDD thereby gradually flows to the power supply line VDDV via the first transistors TP1, thus slightly charging the power supply line VDDV.

The first control signal CNT1 then arrives at the second buffer BUFF2 via the power enable line PWEN1. The number of NMOS transistors connected in series within the inverter circuit IN1 included in the first buffer BUFF1 and an RC delay time caused by the power enable line PWEN1 determine the time taken until the first control signal CNT1 arrives at the second buffer BUFF2 from the first buffer BUFF1.

After receiving the first control signal CNT1, the second buffer BUFF2 outputs the second control signal CNT2 to the power enable lines PWEN2 and PWEN3. At this time, the second control signal CNT2 is at a low level voltage (VSS, for example). Therefore, the second control signal CNT2 controls the state of the second transistors TP2 in the first power switch cells PSC1 and that of the third transistors TP3 in the second power switch cells PSC2 into a conductive state in parallel. The current from the power supply VDD thereby flows to the power supply line VDDV via the second and third transistors TP2 and TP3, thus charging the power supply line VDDV. At this time, the second and third transistors TP2 and TP3 are all controlled into a normal conductive state. Accordingly, the current higher than that flowing via the first transistors TP1 flows to the power supply line VDDV via the second and third transistors TP2 and TP3. The power supply line VDDV is thereby quickly charged.

Thereafter, when the second control signal CNT2 arrives at the first buffer BUFF1, the first buffer BUFF1 sets the power enable line PWEN1 at a low level voltage and also sets the first transistors TP1 into the normal conductive state.

In this way, according to the first embodiment, the second buffer BUFF2 propagates the second control signal CNT2 to the branched power enable lines PWEN2 and PWEN3 in parallel. With this configuration, when the supply of power to the circuit block ICB starts, the first control signal CNT1 drives the first transistors TP1 into the slightly conductive state, the second buffer BUFF2 then propagates the second control signal CNT2 to the branched power enable lines PWEN2 and PWEN3 in parallel, and the second buffer BUFF2 controls the second transistors TP2 and the third transistors TP3 into the conductive state in parallel (simultaneously). Therefore, the switch circuit SWC can slightly charge the power supply line VDDV first and then return the voltage of the power supply line VDDV in a short time. That is, when power of the circuit block ICB is to be returned, the power of the circuit block ICB can be promptly returned while suppressing the inrush current flowing to the power supply line VDDV. In other words, according to the first embodiment, it is possible to achieve both the suppression of the inrush current from flowing to the power supply line VDDV and the return of the voltage of the power supply line VDDV in a short time.

Furthermore, the length of the power enable line PWEN1 is equal to a distance between the first and second buffers BUFF1 and BUFF2 (the length of the first side S1 of the circuit block ICB). Accordingly, the power enable line PWEN1 can be shortened in comparison with that of the reference embodiment described below. Therefore, the first control signal CNT1 having an analog intermediate potential is hardly affected by noise from other circuit blocks. As a result, it is possible to suppress a failure that the first transistor TP1 remains in an OFF-state without turning into the intermediate state at the beginning of power return.

According to the first embodiment, there is no need to return the second control signal CNT2 propagated on the power enable line PWEN3 provided on the side S3 of the circuit block ICB opposite to the first side S1 thereof to the first or second side S1 or S2. Therefore, the first embodiment is effective when the circuit block ICB, which is a power shutoff region, is long in a longitudinal direction of FIG. 2 (an extending direction of the second side S2). For example, the first embodiment is effective for a semiconductor integrated circuit having a large chip size as a memory device.

The sides S1 to S3 can be set to any sides of the circuit block ICB as long as the arrangement relation is kept among the sides S1 to S3.

(Reference Embodiment)

In a reference embodiment, to suppress such an inrush current, it is proposed to take the following measures. The power switch is divided into a plurality of switches (hereinafter, also "main power switch" and "sub-power switch"), and the main power switch and sub-power switch are sequentially turned on. According to this measure, a wire is simply wound around a circuit corresponding to the power switches. The sub-power switch having a relatively small channel width is firstly turned on, and the main power switch having a relatively large channel width is then turned on by using RC delay in the wire. With this configuration, the power supply line can be gradually charged and therefore the inrush current can be suppressed. This is an effective measure to obtain a necessary delay time when a circuit block to which the supply of power is to be shut off is relatively small.

Meanwhile, when the circuit block to which the supply of power is to be shut off is large, the delay time becomes too long to cause the power to return to the circuit block quickly.

Furthermore, a gate signal for actuating the sub-power switches has an analog intermediate potential. Accordingly, when a gate wire is long, the gate signal easily receives noise. If the gate signal receives the noise, a delay time at the time the power returns to the sub-power switches differs from a desired value. For example, the sub-power switches are possibly not turned on normally or noise is possibly generated because of too fast power return. Moreover, if the sub-power switches receive the noise during the power shutoff, the sub-power switches may be inadvertently turned on.

The present embodiments do not have such problems that the reference embodiment has.

(Second Embodiment)

Figure 4:
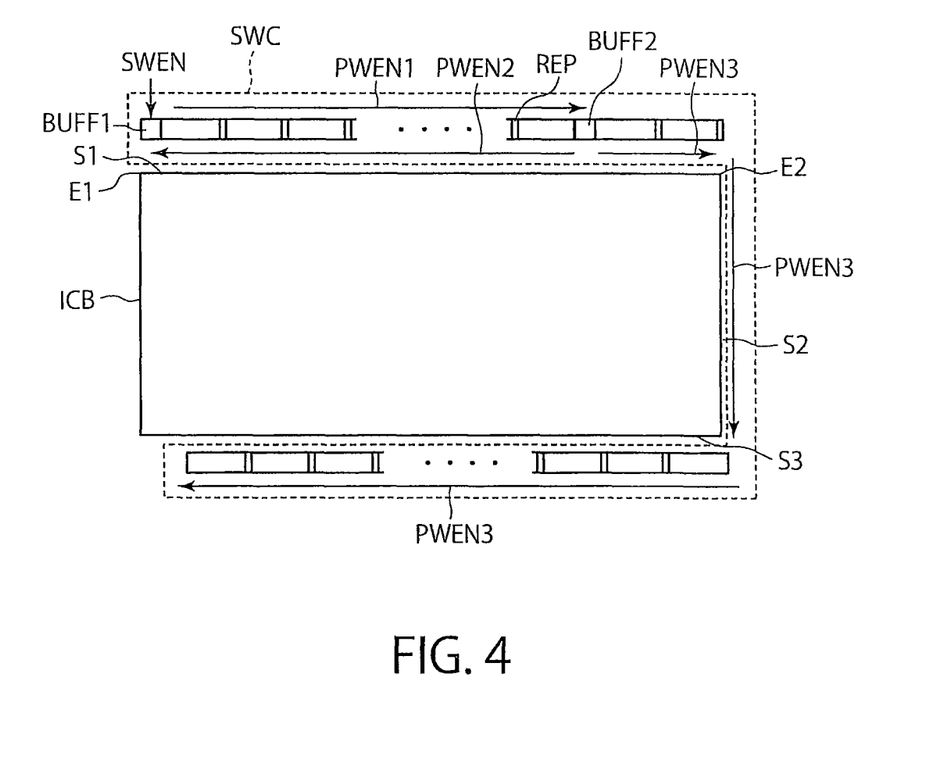
FIG. 4 is a schematic layout diagram showing an arrangement of the circuit block ICB and the switch circuit SWC corresponding thereto according to a second embodiment.
Figure 5:
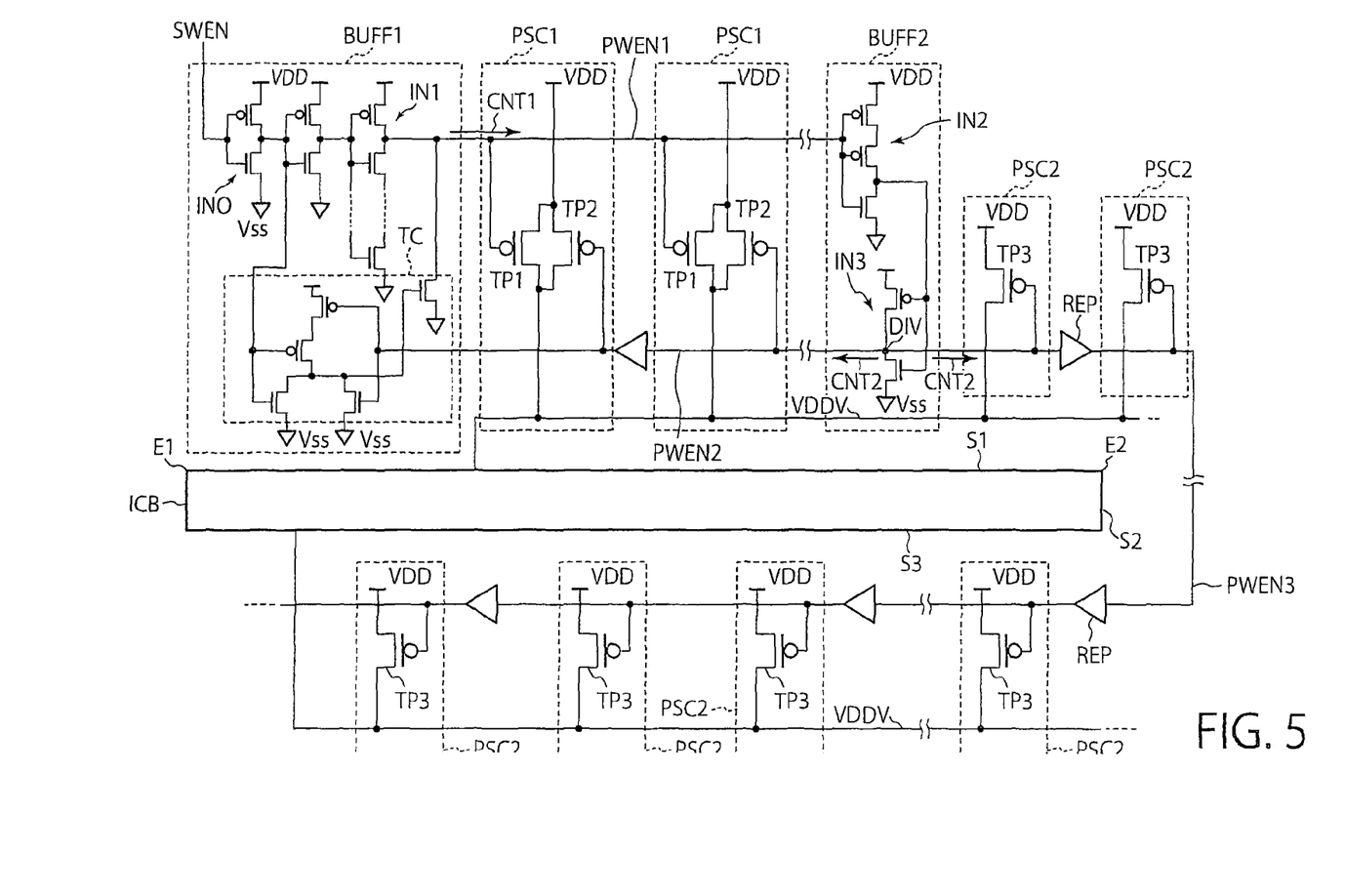
FIG. 5 is a circuit diagram showing a configuration of the switch circuit SWC according to the second embodiment.

FIG. 4 is a schematic layout diagram showing an arrangement of the circuit block ICB and the switch circuit SWC corresponding thereto according to a second embodiment. FIG. 5 is a circuit diagram showing a configuration of the switch circuit SWC according to the second embodiment. In the second embodiment, the first buffer BUFF1 is arranged on one end E1 of the first side S1 of the circuit block ICB similarly to the first embodiment. Meanwhile, the second buffer BUFF2 is arranged at some point along the first side S1 differently from the first embodiment. Therefore, the power enable lines PWEN1 and PWEN2 are provided between the first and second buffers BUFF1 and BUFF2 along the first side S1 of the circuit block ICB while being shorter than the first side S1.

The power enable line PWEN3 serving as the third node is provided to extend from the second buffer BUFF2 to the other end E2 of the first side S1 and further provided along the second side S2 of the circuit block ICB adjacent to the first side S1 and along the side S3 thereof opposite to the first side S1. That is, the power enable line PWEN3 is provided not only along the sides S2 and S3 but also along a part of the first side S1. Similarly to the first embodiment, the power enable lines PWEN2 and PWEN3 branch out and extend from the second buffer BUFF2.

Other configurations of the second embodiment can be identical to corresponding ones of the first embodiment. Therefore, the second embodiment can also achieve effects of the first embodiment.

Furthermore, the arrangement of the second buffer BUFF2 at some point along the first side S1 of the circuit block ICB can reduce the distance between the first and second buffers BUFF1 and BUFF2 even when the first side S1 is long. The power enable line PWEN1 can be thereby shortened. Thus, the first control signal CNT1 having the analog intermediate potential is hardly affected by a noise from other circuit blocks. As can be understood, the second embodiment is effective for the circuit block ICB having a long first side S1.

(Third Embodiment)

Figure 6:
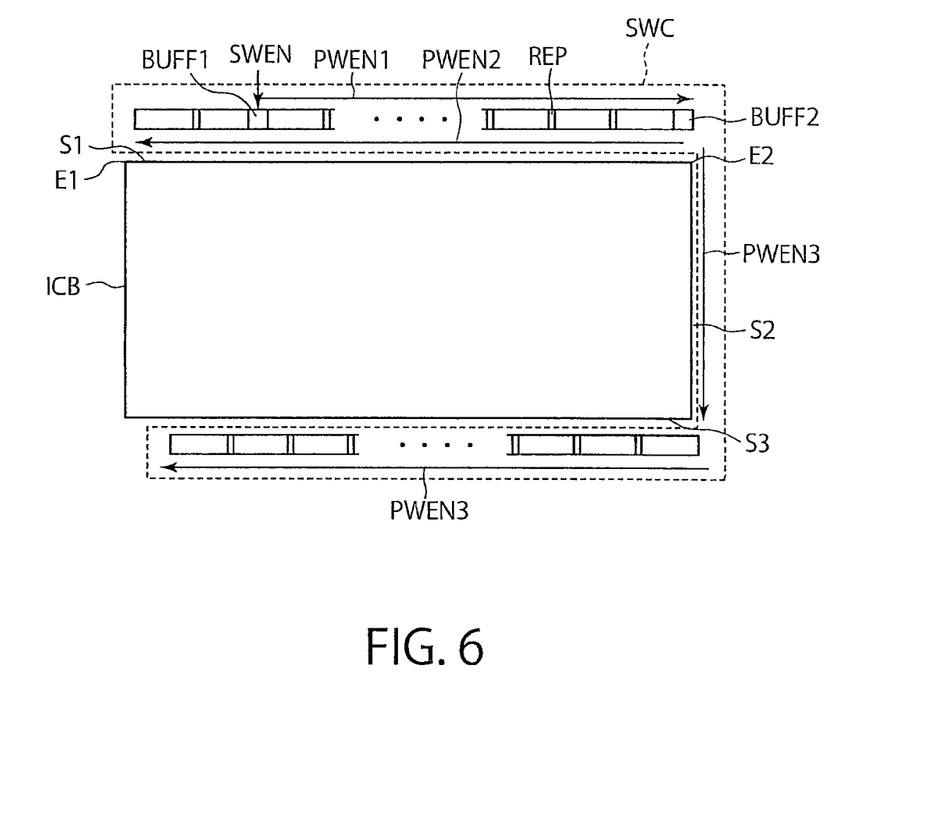
FIG. 6 is a schematic layout diagram showing an arrangement of the circuit block ICB and the switch circuit SWC corresponding thereto according to a third embodiment.
Figure 7:
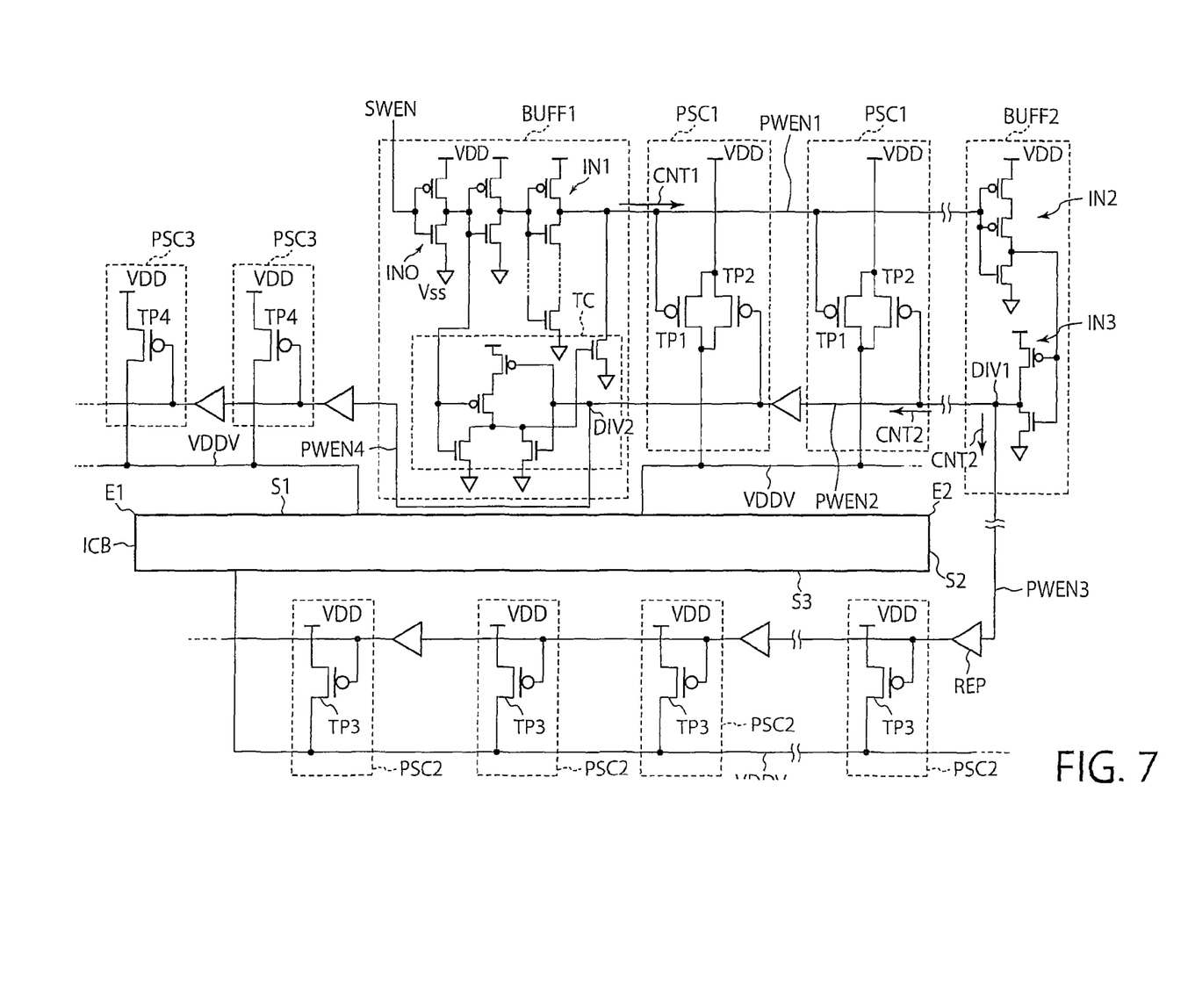
FIG. 7 is a circuit diagram showing a configuration of the switch circuit SWC according to the third embodiment.

FIG. 6 is a schematic layout diagram showing an arrangement of the circuit block ICB and the switch circuit SWC corresponding thereto according to a third embodiment. FIG. 7 is a circuit diagram showing a configuration of the switch circuit SWC according to the third embodiment. In the third embodiment, the first buffer BUFF1 is arranged at some point along the first side S1 of the circuit block ICB. The second buffer BUFF2 is arranged on the other end E2 of the first side S1. Therefore, the power enable lines PWEN1 and PWEN2 are provided between the first and second buffers BUFF1 and BUFF2 along the first side S1 of the circuit block ICB while being shorter than the first side S1.

The power enable line PWEN3 serving as the third node is provided to extend from the second buffer BUFF2 along the second side S2 of the circuit block ICB adjacent to the first side S1 and along the side S3 thereof opposite to the first side S1.

Similarly to the first embodiment, the power enable lines PWEN2 and PWEN3 branch out and extend from the second buffer BUFF2.

In the third embodiment, the switch circuit SWC further includes fourth transistors TP4 and a power enable line PWEN4 serving as a fourth node. Each of the fourth transistors TP4 is connected between the power supply line VDDV and the power supply VDD and can be configured similarly to the third transistor TP3. The fourth transistor TP4 is included in each of the third power switch cells PSC3. The third power switch cell PSC3 can be configured similarly to the second power switch cell PSC2. The power enable line PWEN4 is connected to a gate of each fourth transistor TP4. The power enable line PWEN4 is a wire provided to extend from the first buffer BUFF1 to one end E1 of the first side S1 of the circuit block ICB along the first side S1. The power enable line PWEN4 is branched off from the power enable line PWEN2 at a branch point DIV2 in the first buffer BUFF1 and extends therefrom.

Other configurations of the third embodiment can be identical to corresponding ones of the first embodiment. Therefore, the third embodiment can also achieve the effects of the first embodiment.

Furthermore, the arrangement of the first buffer BUFF1 at some point along the first side S1 of the circuit block ICB can reduce the distance between the first and second buffers BUFF1 and BUFF2 even when the first side S1 is long. The power enable line PWEN1 can be thereby shortened. Thus, the first control signal CNT1 having the analog intermediate potential is hardly affected by a noise from other circuit blocks.

Further, in the third embodiment, the switch circuit SWC includes the fourth transistors TP4 and the power enable line PWEN4. Therefore, it is possible to further reduce the recovery time of the voltage of the power supply line VDDV. The third embodiment is effective for the circuit block ICB having a long first side S1.

(Fourth Embodiment)

Figure 8:
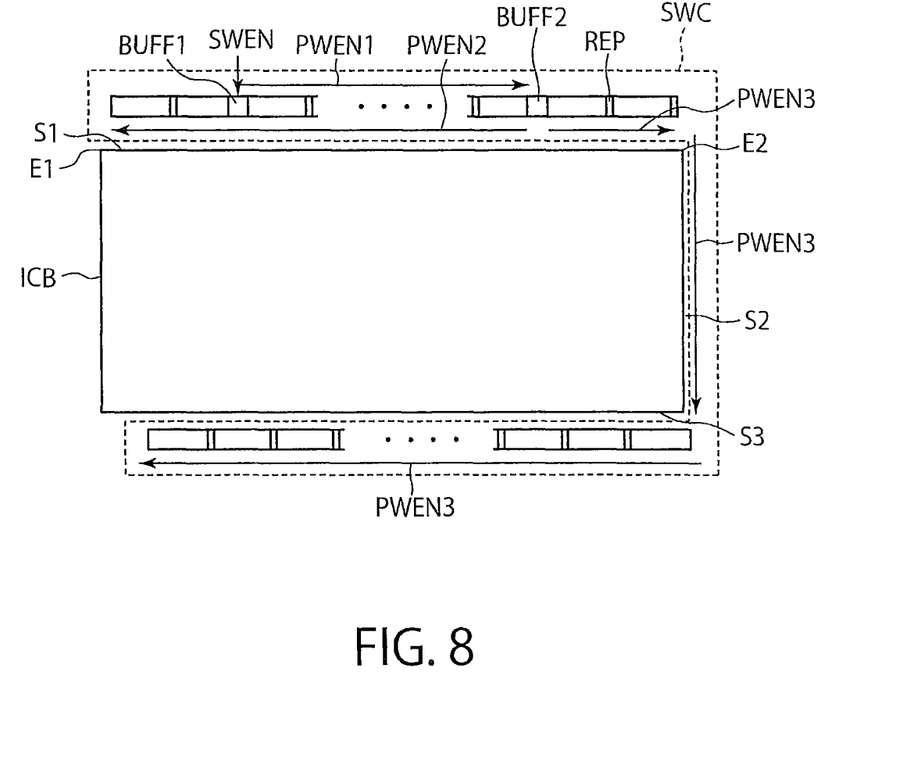
FIG. 8 is a schematic layout diagram showing an arrangement of the circuit block ICB and the switch circuit SWC corresponding thereto according to a fourth embodiment.
Figure 9:
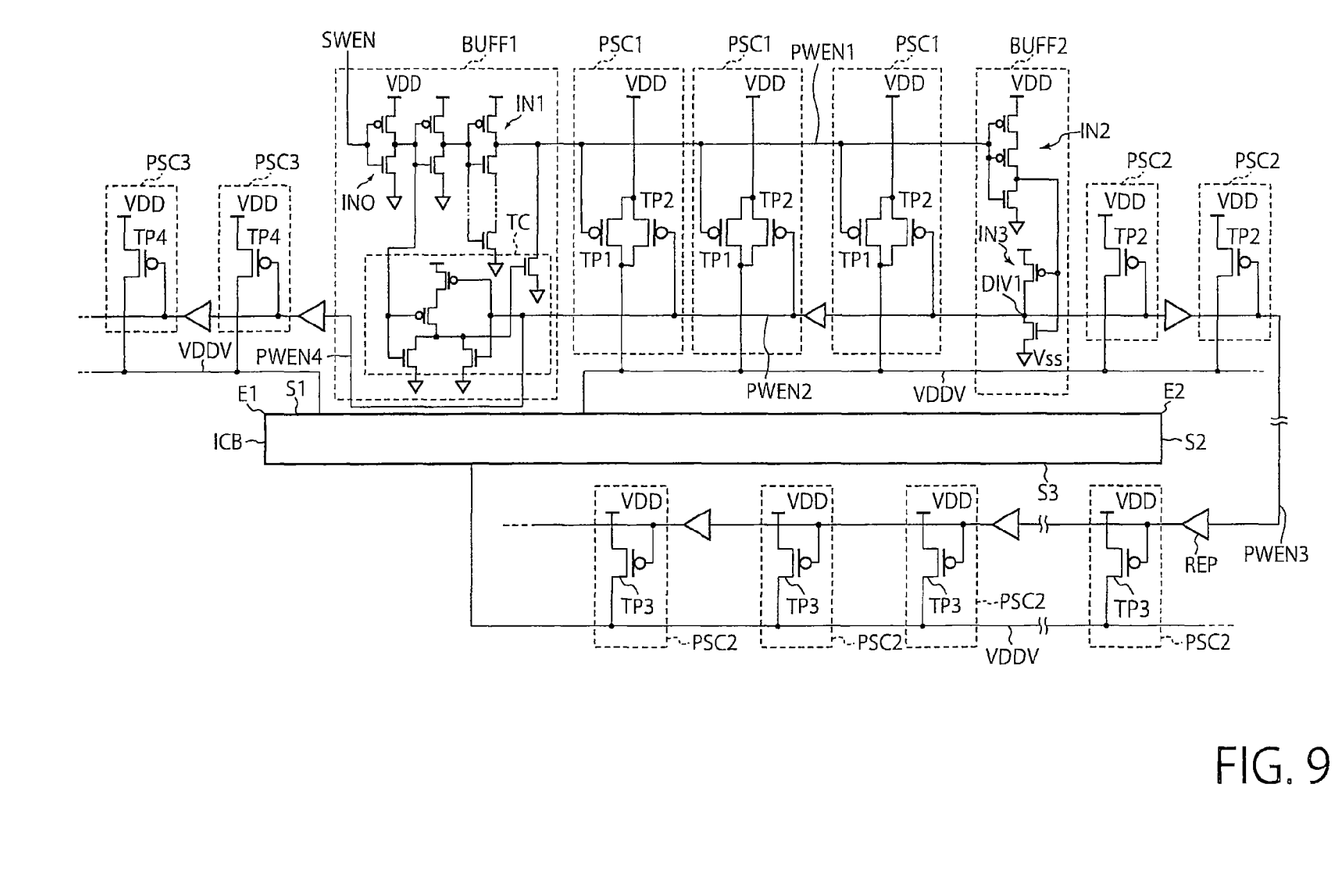
FIG. 9 is a circuit diagram showing a configuration of the switch circuit SWC according to the fourth embodiment.

FIG. 8 is a schematic layout diagram showing an arrangement of the circuit block ICB and the switch circuit SWC corresponding thereto according to a fourth embodiment. FIG. 9 is a circuit diagram showing a configuration of the switch circuit SWC according to the fourth embodiment. The fourth embodiment is a combination of the second and third embodiments. Therefore, in the fourth embodiment, the first and second buffers BUFF1 and BUFF2 are arranged at some point along the first side S1 of the circuit block ICB. The power enable lines PWEN1 and PWEN2 are provided between the first and second buffers BUFF1 and BUFF2 along the first side S1 of the circuit block ICB while being shorter than the first side S1.

The power enable line PWEN3 serving as the third node is provided to extend from the second buffer BUFF2 to the other end E2 of the first side S1 and further provided along the second side S2 of the circuit block ICB adjacent to the first side S1 and along the side S3 thereof opposite to the first side S1. That is, the power enable line PWEN3 is provided not only along the sides S2 and S3 but also along a part of the first side S1.

Similarly to the first embodiment, the power enable lines PWEN2 and PWEN3 branch out and extend from the second buffer BUFF2.

In the fourth embodiment, the switch circuit SWC further includes the fourth transistors TP4 and the power enable line PWEN4 serving as the fourth node. Each of the fourth transistors TP4 is provided between the power supply line VDDV and the power supply VDD and can be configured similarly to the third transistor TP3. The fourth transistor TP4 is included in each of the third power switch cells PSC3. The third power switch cell PSC3 can be configured similarly to the second power switch cell PSC2. The power enable line PWEN4 is connected to a gate of each fourth transistor TP4. The power enable line PWEN4 is a wire provided to extend from the first buffer BUFF1 to one end E1 of the first side S1 of the circuit block ICB along the first side S1. The power enable line PWEN4 is branched off from the power enable line PWEN2 at the branch point DIV2 in the first buffer BUFF1 and extends therefrom.

Other configurations of the fourth embodiment can be identical to corresponding ones of the first embodiment. Therefore, the fourth embodiment can also achieve effects of the second and third embodiments.

(Modification of the First Embodiment)

FIG. 10 is a circuit diagram showing a configuration of a switch circuit SWC using the N-FETs in the power cell switches PSC1 and PSC2. In FIG. 10, the first to third transistors are N-FETs and denoted by TN1 to TN3, respectively.

In the present modification, the ground line VSSV supplies power to the circuit block ICB. The first and second transistors TN1 and TN2 are connected in parallel between the ground line VSSV and the ground potential VSS. The third transistors TN3 are connected between the ground line VSSV and the ground potential VSS. Other configurations of this modification can be identical to corresponding ones of the first embodiment.

Therefore, this modification can also achieve effects of the first embodiment. Furthermore, this modification can be also applicable to the second to fourth embodiments.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit device comprising:
   a circuit block;
   a power supply line or a ground line configured to supply power to the circuit block;
   at least one pair of transistors including first and second transistors connected between the power supply line and a power supply or between the ground line and a ground potential;
   at least one third transistor connected between the power supply line and the power supply or between the ground line and the ground potential;
   first to third nodes connected to gates of the first to the third transistors, respectively;
   a first buffer configured to output a first control signal to the first node, the first control signal controlling a conductive state of the first transistor; and
   a second buffer connected between the first node and the second and third nodes, the second buffer configured to receive the first control signal and to transmit a second control signal to the second and the third nodes, the second control signal being a signal delayed from the first control signal and controlling a conductive state of the second and the third transistors, wherein when supply of the power to the circuit block starts, the second control signal controls the second and the third transistors into the conductive state after the first control signal controls the first transistor to be driven in an intermediate state between the conductive state and a shutoff state.

2. The device of claim 1, wherein the first buffer is arranged on one end of a first side of the circuit block, the second buffer is arranged at some point along the first side, the first and the second nodes are wires provided between the first buffer and the second buffer along the first side of the circuit block, the third node is a wire provided to extend from the second buffer to the other end of the first side, and further provided along a second side of the circuit block adjacent to the first side and along an opposite side of the circuit block opposite to the first side, and the second and the third nodes branch out and extend from the second buffer.

3. The device of claim 1, wherein the first and the second buffers are arranged on both ends of a first side of the circuit block, respectively, the first and the second nodes are wires provided between the first buffer and the second buffer along the first side of the circuit block, the third node is a wire provided along a second side and an opposite side, the second side being adjacent to the first side at an end on which the second buffer is arranged, the opposite side being opposite to the first side, and the second and the third nodes branch out and extend from the second buffer.

4. The device of claim 1, wherein the first buffer is arranged at some point along a first side of the circuit block, the second buffer is arranged on one end of the first side, the first and the second nodes are wires provided between the first buffer and the second buffer along the first side of the circuit block, the third node is a wire provided along a second side and an opposite side, the second side being adjacent to the first side at an end on which the second buffer is arranged, the opposite side being opposite to the first side, and the second and the third nodes branch out and extend from the second buffer.

5. The device of claim 4, further comprising:

at least one fourth transistor connected between the power supply line and the power supply or between the ground line and the ground potential; and a fourth node connected to a gate of the fourth transistor, wherein the fourth node is a wire provided to extend from the first buffer to the one end of the first side of the circuit block along the first side, and the fourth node is branched off and extends from the second node in the first buffer.

6. The device of claim 1, wherein the first and the second buffers are arranged at some point along a first side of the circuit block, the first and the second nodes are wires provided between the first buffer and the second buffer along the first side of the circuit block, the third node is a wire provided to extend from the second buffer to the other end of the first side, and further provided along a second side of the circuit block adjacent to the first side and along a side of the circuit block opposite to the first side, and the second and the third nodes branch out and extend from the second buffer.

7. The device of claim 6, further comprising:

at least one fourth transistor connected between the power supply line and the power supply or between the ground line and the ground potential; and a fourth node connected to a gate of the fourth transistor, wherein the fourth node is a wire provided to extend from the first buffer to the one end of the first side of the circuit block along the first side, and the fourth node is branched off and extends from the second node in the first buffer.

8. The device of claim 1, wherein the first to the third nodes are provided around the circuit block as wires.

9. The device of claim 8, wherein the first buffer is arranged at some point along a first side of the circuit block, the second buffer is arranged on one end of the first side, the first and the second nodes are wires provided between the first buffer and the second buffer along the first side of the circuit block, the third node is a wire provided along a second side and an opposite side, the second side being adjacent to the first side at an end on which the second buffer is arranged, the opposite side being opposite to the first side, and the second and the third nodes branch out and extend from the second buffer.

10. The device of claim 9, further comprising:

at least one fourth transistor connected between the power supply line and the power supply or between the ground line and the ground potential; and a fourth node connected to a gate of the fourth transistor, wherein the fourth node is a wire provided to extend from the first buffer to the one end of the first side of the circuit block along the first side, and the fourth node is branched off and extends from the second node in the first buffer.

11. The device of claim 8, wherein the first and the second buffers are arranged on both ends of a first side of the circuit block, respectively, the first and the second nodes are wires provided between the first buffer and the second buffer along the first side of the circuit block, the third node is a wire provided along a second side and an opposite side, the second side being adjacent to the first side at an end on which the second buffer is arranged, the opposite side being opposite to the first side, and the second and the third nodes branch out and extend from the second buffer.

12. The device of claim 8, wherein the first buffer is arranged on one end of a first side of the circuit block, the second buffer is arranged at some point along the first side, the first and the second nodes are wires provided between the first buffer and the second buffer along the first side of the circuit block, the third node is a wire provided to extend from the second buffer to the other end of the first side, and further provided along a second side of the circuit block adjacent to the first side and along an opposite side of the circuit block opposite to the first side, and the second and the third nodes branch out and extend from the second buffer.

13. The device of claim 8, wherein the first and the second buffers are arranged at some point along a first side of the circuit block, the first and the second nodes are wires provided between the first buffer and the second buffer along the first side of the circuit block, the third node is a wire provided to extend from the second buffer to the other end of the first side, and further provided along a second side of the circuit block adjacent to the first side and along a side of the circuit block opposite to the first side, and the second and the third nodes branch out and extend from the second buffer.

14. The device of claim 13, further comprising:

at least one fourth transistor connected between the power supply line and the power supply or between the ground line and the ground potential; and a fourth node connected to a gate of the fourth transistor, wherein the fourth node is a wire provided to extend from the first buffer to the one end of the first side of the circuit block along the first side, and the fourth node is branched off and extends from the second node in the first buffer.

15. The device of claim 1, wherein the first to the third nodes are metal wires.

* * * * *